(12) United States Patent
Akiyama

(10) Patent No.: US 7,919,835 B2
(45) Date of Patent: Apr. 5, 2011

(54) SEMICONDUCTOR DEVICE AND METHOD FOR MANUFACTURING THE SAME

(75) Inventor: Kazutaka Akiyama, Matsudo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/332,059

(22) Filed: Dec. 10, 2008

(65) Prior Publication Data

US 2009/0152602 A1      Jun. 18, 2009

(30) Foreign Application Priority Data

Dec. 17, 2007   (JP) ................................ 2007-324907

(51) Int. Cl.
*H01L 29/40* (2006.01)
(52) U.S. Cl. ........ 257/621; 257/632; 257/635; 257/684; 257/686; 257/689; 257/E23.01
(58) Field of Classification Search .................. 257/621, 257/684, 686, 698, 774, 776, 632, 635, 689
See application file for complete search history.

(56) References Cited

U.S. PATENT DOCUMENTS

| | | | |
|---|---|---|---|
| 6,707,157 B2 | 3/2004 | Hoshino | |
| 2002/0027293 A1* | 3/2002 | Hoshino | 257/774 |
| 2005/0101040 A1 | 5/2005 | Lai et al. | |
| 2005/0221601 A1 | 10/2005 | Kawano | |
| 2005/0233581 A1 | 10/2005 | Soejima et al. | |
| 2009/0014881 A1* | 1/2009 | Endo et al. | 257/758 |

FOREIGN PATENT DOCUMENTS

WO   WO 2005/022631 A1   3/2005

* cited by examiner

*Primary Examiner* — Wai-Sing Louie
(74) *Attorney, Agent, or Firm* — Finnegan, Henderson, Farabow, Garrett & Dunner, L.L.P.

(57) ABSTRACT

The present invention provides a semiconductor device having a low-k film including an interconnect layer and a highly-reliable through-substrate contact plug. The semiconductor device includes:
  a semiconductor substrate having a first surface and a second surface facing each other;
  a first insulating film formed on the first surface of the semiconductor substrate and having a specific permittivity of 4 or higher;
  a circuit constituent element formed on the first surface of the semiconductor substrate and covered with the first insulating film);
  a contact plug formed in the first insulating film and electrically connected to the circuit constituent element;
  a through-substrate contact plug penetrating through the semiconductor substrate and the first insulating film;
  a second insulating film formed on the first insulating film and having a specific permittivity of 3.5 or lower;
  an interconnect layer formed in the second insulating film and electrically connected to the through-substrate contact plug and the contact plug;
  a first electrode formed in an exposed state and external to the second insulating film and electrically connected to the interconnect layer; and
  a second electrode formed in an exposed state and external to the second surface of the semiconductor substrate and electrically connected to the through-substrate contact plug.

9 Claims, 14 Drawing Sheets

SEMICONDUCTOR DEVICE AND METHOD FOR MANUFACTURING THE SAME

CROSS REFERENCE TO RELATED APPLICATIONS

This application is based upon and claims the benefit of priority from prior Japanese Patent Application No. 2007-324907, filed on Dec. 17, 2007, the entire contents of which are incorporated herein by reference.

BACKGROUND OF THE INVENTION

1. Field of the Invention

The present invention relates to a semiconductor device and a method for manufacturing the semiconductor device and, for example, to a semiconductor device including a contact plug penetrating through a substrate and a method for manufacturing the semiconductor device.

2. Background Art

In recent years, there has been an increasingly exacting demand for a reduction in the size of components themselves and in the number thereof. This demand is directed toward components for use mainly in mobile devices, such as a cellular phone, in order to downsize the device as a whole. Accordingly, a semiconductor chip is required to be miniaturized or a multitude of semiconductor chips are required to be mounted in a single component. More specifically, a semiconductor element is required to be miniaturized in every generation (every two to three years) by as much as 70% from the size of thereof one generation earlier. In addition, there is the requirement that different types of semiconductor chips, including a DRAM, an SRAM, a logic element and an analog element, be mounted in a stacked manner.

Examples of a method for mounting a plurality of semiconductor chips in a stacked manner include SiP (System in Package) and MCL (Multi-Chip-LSI). Such an SiP device and an MCL device as mentioned above are generally manufactured in the following manner. First, an interconnect composed of one or a plurality of layers is formed on a semiconductor element, such as a MOS transistor, formed on an Si substrate. After this, there is formed a pad for an electrode to be electrically connected to part of the interconnect. Next, a bump electrode is formed on this pad using a metal such as gold (Au), copper (Cu) or tin (Sn). Next, this bump electrode is connected to an external electrode with a bonding wire, or a plurality of semiconductor chips are stacked by directly bonding the bump electrodes thereof to one another, and then mounted in a package.

When mounting semiconductor chips in a package by leading out the interconnects thereof using bonding wires as in the case of the SiP, it is possible to mount three or more semiconductor chips. However, the size of a semiconductor device after mounting increases by as much as at least the length of a bonding wire with respect to the size of a semiconductor chip.

When bonding bump electrodes formed on a surface of each semiconductor chip to one another with two semiconductor chips facing each other as in the case of the MCL, it is possible to stack the two semiconductor chips without using bonding wires. However, it is difficult to stack three or more semiconductor chips.

Hence, International Patent Laid-Open No. 2005-022631, for example, proposes means for stacking three or more semiconductor chips without using bonding wires. That is, there is formed a contact plug penetrating through the front and rear surfaces of an Si substrate (hereinafter referred to as a through-substrate contact plug). Then, electrode pads on the front and rear surface sides of the Si substrate are formed respectively, so as to conduct electricity through this through-substrate contact plug. In addition, the international publication proposes a method for electrically connecting the electrode pads formed on the front and rear surface sides of the Si substrate by way of the through-substrate contact plug.

Accordingly, along with an advance in the miniaturization and speeding-up of a semiconductor circuit, there has been the requirement that a low-dielectric constant insulating film (hereinafter referred to as a low-k film) be used as an insulating film for an interconnect layer, in order to reduce parasitic capacitance between interconnects. In fact, this requirement has led to the manufacture of a product, in which a low-k film is used in an interconnect layer, as the most-advanced logic device product.

SUMMARY OF THE INVENTION

According to one aspect of the present invention, there is provided a semiconductor device including:

a semiconductor substrate having a first surface and a second surface facing each other;

a first insulating film formed on the first surface of the semiconductor substrate and having a specific permittivity of 4 or higher;

a circuit constituent element formed on the first surface of the semiconductor substrate and covered with the first insulating film);

a contact plug formed in the first insulating film and electrically connected to the circuit constituent element;

a through-substrate contact plug penetrating through the semiconductor substrate and the first insulating film;

a second insulating film formed on the first insulating film and having a specific permittivity of 3.5 or lower;

an interconnect layer formed in the second insulating film and electrically connected to the through-substrate contact plug and the contact plug;

a first electrode formed in an exposed state and external to the second insulating film and electrically connected to the interconnect layer; and a second electrode formed in an exposed state and external to the second surface of the semiconductor substrate and electrically connected to the through-substrate contact plug.

According to another aspect of the present invention, there is provided a semiconductor device including:

a semiconductor substrate having a first surface and a second surface facing each other;

a first insulating film formed on the first surface of the semiconductor substrate and having a specific permittivity of 4 or higher;

a circuit constituent element formed on the first surface of the semiconductor substrate and covered with the first insulating film;

a contact plug formed in the first insulating film and electrically connected to the circuit constituent element;

a through-substrate contact plug penetrating through the semiconductor substrate and the first insulating film;

a second insulating film formed on the first insulating film and having a specific permittivity of 3.5 or lower;

a first interconnect layer formed in the second insulating film and electrically connected to the through-substrate contact plug and the contact plug;

a third insulating film formed on the second insulating film and having a specific permittivity of 3.5 or lower;

a second interconnect layer formed in the third insulating film;

a via contact formed in the third insulating film so as to electrically connect the first interconnect layer and the second interconnect layer;

a first electrode formed in an exposed state and external to the third insulating film and electrically connected to the second interconnect layer; and a second electrode formed in an exposed state and external to the second surface of the semiconductor substrate and electrically connected to the through-substrate contact plug.

According to yet another aspect of the present invention, there is provided a method for manufacturing a semiconductor device, including:

preparing a semiconductor substrate having a first surface and a second surface facing each other;

forming a circuit constituent element on the first surface of the semiconductor substrate;

forming a first insulating film having a specific permittivity of 4 or higher on the first surface of the semiconductor device, so as to cover the circuit constituent element;

forming a contact plug to be electrically connected to the circuit constituent element in the first insulating film;

forming a through-substrate contact plug penetrating through the semiconductor substrate and the first insulating film;

forming a second insulating film having a specific permittivity of 3.5 or lower on the first insulating film after forming the through-substrate contact plug;

forming an interconnect layer electrically connected to the through-substrate contact plug and the contact plug in the second insulating film;

forming a first electrode in an exposed state and external to the second insulating film and electrically connected to the interconnect layer; and forming a second electrode in an exposed state and external to the second surface of the semiconductor substrate and electrically connected to the through-substrate contact plug.

DESCRIPTION OF THE EMBODIMENTS

Figure 1A:
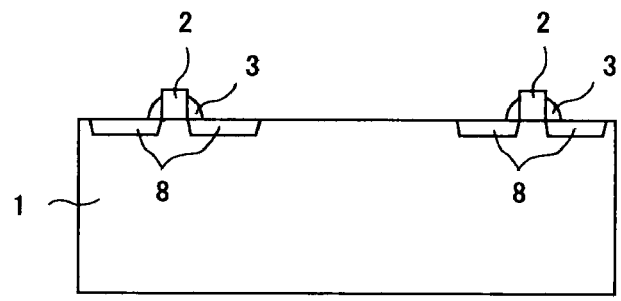
FIG. 1A is a cross-sectional view illustrating a manufacturing step of a semiconductor chip in accordance with a first embodiment.

Before describing embodiments in accordance with the present invention, an explanation will be made of the background that has led the inventor of the present invention to accomplish the present invention.

As described earlier, a low-k film has come into use as an insulating film for an interconnect layer. In general, the dielectric constant of the low-k film is reduced by bonding a methyl group (—CH$_3$) to an Si atom, as typified by SiOCH. However, a problem arises in a device in which the low-k film is used, when forming a through-substrate contact plug. The problem occurs when processing a contact hole penetrating through the Si substrate (hereinafter referred to as the through-substrate contact hole) as described above, as one of steps of forming the through-substrate contact plug. When forming the through-substrate contact hole, a low-k film suffers plasma-induced processing damage due to an etching gas (for example, a C$_4$F$_8$-based gas or an SF$_6$-based gas) used to process a regular insulating film (not a low-k film) and an Si substrate. This processing damage causes various problems such as that the low-k film changes in quality. Examples of these problems include the following:

(i) As the result that a methyl group (—CH$_3$) bonded to an Si atom in the low-k film is oxidized or separates from the Si atom at the time of etching, an Si—CH$_3$ bond changes to a Si—O bond, thus causing a dielectric constant to increase.

(ii) Only a portion corresponding to the low-k film, among the portions of the sidewall of the through-substrate contact hole, is etched, thus producing a step difference. Consequently, a barrier metal is cut off, thus prohibiting the through-substrate contact plug to conduct electricity.

(iii) As explained in item (i), a methyl group (—CH$_3$) in the low-k film is oxidized or removed at the time of etching and, therefore, the Si—CH$_3$ bond changes to the Si—O bond. Consequently, a water molecule (H$_2$0), a hydroxy group (—OH), and the like bond to the periphery of the Si—O bond by means of physical or chemical bonding. Thus, the low-k film becomes liable to absorb moisture. Accordingly, the barrier metal of a via contact and an interconnect around the through-substrate contact plug becomes liable to oxidation. As a result, an electrical conductor migrates in a thermally-accelerated reliability test, thus resulting in interconnection failure (degradation in heat resistance).

Hence, embodiments of the present invention have been implemented so that when forming a through-substrate contact plug, no adverse effects are exerted on a low-k film also in a device in which the low-k film is used as an insulating film for an interconnect layer.

Hereinafter, a description will be made of two embodiments in accordance with the present invention and comparative examples of which the present inventor has the knowledge, by referring to the accompanying drawings. Note that components having the same functionality are denoted by like numerals and will be explained in no more detail. Also note that the scale ratio of each component in the figures is different from the actual scale ratio thereof.

First Embodiment

FIGS. 1A to 1I are cross-sectional process drawings illustrating the manufacturing method of a first embodiment.

(1) First, as shown in FIG. 1A, gate interconnects 2, sidewall insulating films 3, sources/drains 8, element-isolating regions (not illustrated) and the like are formed on an Si substrate 1 to fabricate a MOS-FET. As is generally known, these gate interconnects 2 have poly-Si gate electrodes and SiO$_2$ gate oxide films.

Figure 1B:
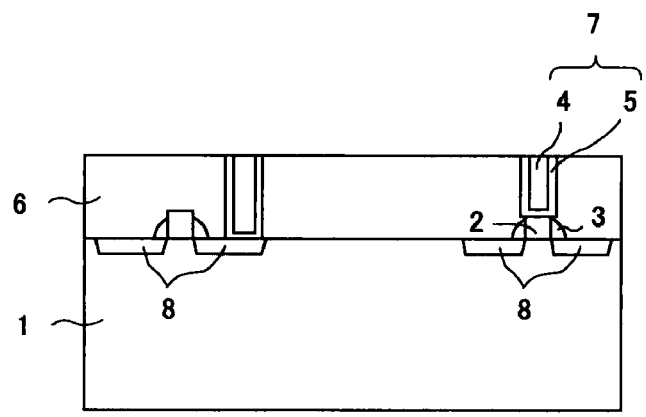
FIG. 1B is a cross-sectional view illustrating a manufacturing step following the manufacturing step of the semiconductor chip in accordance with the first embodiment illustrated in FIG. 1A.

(2) Next, as shown in FIG. 1B, a first insulating film 6 having a thickness of 0.5 μm and a specific permittivity "k" of 4 or higher is formed on the MOS-FET. The material of this first insulating film 6 is, for example, SiO$_2$. After that, there is formed a contact plug 7 for connecting a first interconnect layer 16 (described later) and the MOS-FET. This contact plug 7 is formed by film-forming a barrier metal 5 on the inner surface of a contact hole and then burying tungsten 4 therein. As an electrical conductor other than tungsten, copper (Cu), aluminum (Al) or tin (Sn) may be used. As is understood from FIG. 1B, this contact plug 7 is electrically connected to the gate interconnect 2 and the source/drain 8 of the MOS-FET.

Figure 1C:
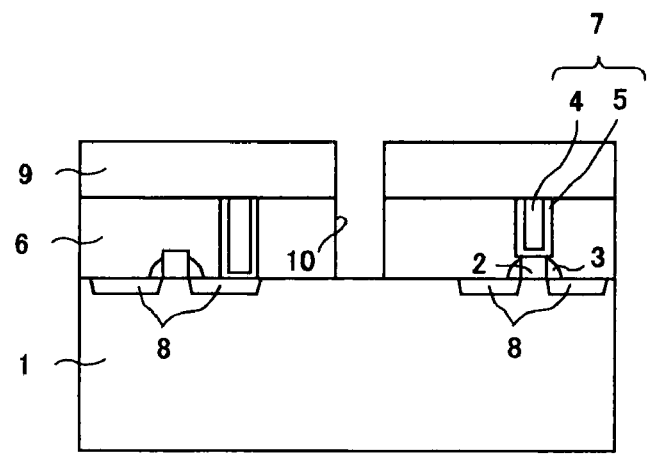
FIG. 1C is a cross-sectional view illustrating a manufacturing step following the manufacturing step of the semiconductor chip in accordance with the first embodiment illustrated in FIG. 1B.

(3) Next, a through-substrate contact hole 10 penetrating through the Si substrate 1 and the first insulating film 6 is processed using an RIE (Reactive Ion Etching) method. Here, it is virtually impossible to process the first insulating film 6 composed of SiO$_2$ and the Si substrate 1 lying thereunder under the same etching conditions. Accordingly, there is first formed a resist mask 9 patterned with holes (approximately 20 μm in diameter) using a photolithography method. After this, the first insulating film 6 is processed using RIE under a C$_4$F$_8$-based gas condition, as shown in FIG. 1C.

(4) Next, the Si substrate 1 is processed using an RIE method under an SF$_6$-based gas condition, with the resist mask 9 left over. As is understood from FIG. 1D, the Si substrate 1 is processed to a depth partway therethrough. That is, the Si substrate 1 is processed to a depth of 50 μm from the front surface thereof by specifying a processing time derived from a processing speed. Note that when the Si substrate 1 is processed by RIE, the Si substrate 1 may be processed through to the rear surface thereof.

Also note that an SF$_6$-based gas has a high processing selection ratio between Si and SiO$_2$. Accordingly, it is also possible to process the Si substrate 1 using the previously processed SiO$_2$ pattern (first insulating film 6) as a mask, rather than using the resist mask 9.

Figure 1D:
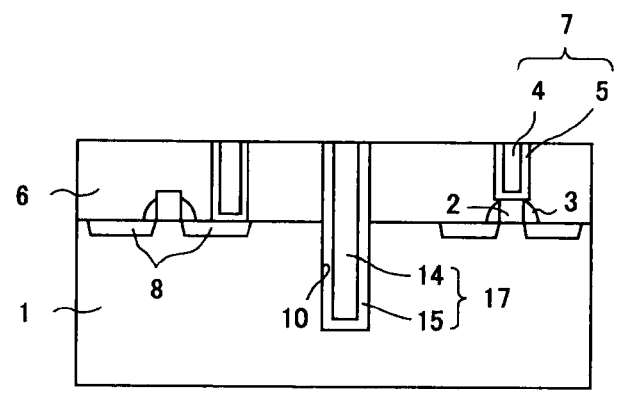
FIG. 1D is a cross-sectional view illustrating a manufacturing step following the manufacturing step of the semiconductor chip in accordance with the first embodiment illustrated in FIG. 1C.

(5) Next, as shown in FIG. 1D, an SiO$_2$ contact sidewall insulating film 15 is formed using a plasma CVD method on the inner wall of the through-substrate contact hole 10 processed to a depth partway through the Si substrate 1. After this, a through-substrate contact metal 14 serving as an electrical conductor is buried in the contact hole. The burial of this through-substrate contact metal 14 is achieved by film-forming a Ti-based barrier metal (not illustrated) on the contact sidewall insulating film 15 using a sputtering method or a CVD method, and then film-forming tungsten (W) using a CVD method. After this, electrical conductors (barrier metal and tungsten) in a field section are removed using a CMP method to form a through-substrate contact plug 17.

As another method for burying the through-substrate contact metal 14, there may be used a method for burying copper (Cu) in the through-substrate contact hole 10 using a plating method, and then removing the electrical conductors in the field section using a CMP method. In addition, aluminum (Al) or tin (Sn) may be used as the through-substrate contact metal 14.

Figure 1E:
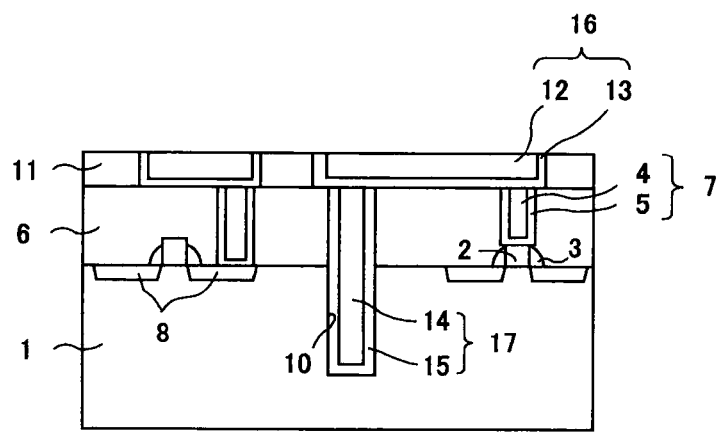
FIG. 1E is a cross-sectional view illustrating a manufacturing step following the manufacturing step of the semiconductor chip in accordance with the first embodiment illustrated in FIG. 1D.

(6) Next, as shown in FIG. 1E, a second insulating film 11 is formed on the first insulating film 6. This second insulating film 11 is a low-k film having a thickness of 0.5 μm and a specific permittivity "k" of 3.5 or lower. Next, a resist film (not illustrated) is formed on this second insulating film 11 and an interconnect pattern having a line/space ratio of 0.1 μm/0.1 μm is formed using a lithography method. After this, the second insulating film 11 is processed along this interconnect pattern using an RIE method to form a trench. Next, a Ta-based barrier metal 13A (not illustrated) is film-formed on the surface of this trench using a sputtering method. Using this barrier metal 13A and a copper seed film, copper 12A (not illustrated) is buried in the trench by a plating method. After this, the barrier metal 13A and the copper 12A in the field section are removed using a CMP method to form a first interconnect layer 16 made of a barrier metal 13 and copper 12. Note that as an interconnect material, tungsten (W), aluminum (Al) or tin (Sn) may be used in place of copper (Cu). FIG. 1E illustrates a cross-sectional view of a chip after the first interconnect layer 16 is formed. Here, as the second insulating film 11 having a specific permittivity "k" of 3.5 or lower, there was used an insulating film formed using a CVD method and having an SiOC-based composition and a specific permittivity "k" of 3. An inorganic material consisting primarily of SiOF or SiOCH or an organic material consisting primarily of polyarylether (PAr) may be used in place of SiOC.

Figure 1F:
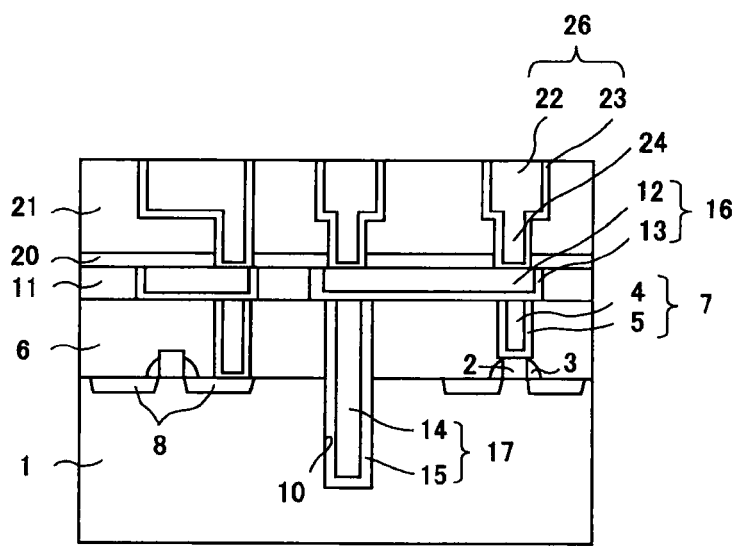
FIG. 1F is a cross-sectional view illustrating a manufacturing step following the manufacturing step of the semiconductor chip in accordance with the first embodiment illustrated in FIG. 1E.

(7) Next, as shown in FIG. 1F, a first cap insulating layer 20 having a film thickness of 0.05 μm is formed on the second insulating film 11. This first cap insulating layer 20 prevents the copper 12 of the first interconnect layer 16 from diffusing into a later-described third insulating film 21 due to heat. This first cap insulating layer 20 is composed of SiN, SiC, SiCN, or the like.

(8) Next, as shown in FIG. 1F, a third insulating film 21 (low-k film) having a thickness of 1 μm is formed on this first cap insulating layer 20. After this, a second interconnect layer 26 having an interconnect pattern the line/space ratio of which is 0.1 μm/0.1 μm is formed. In addition, there is formed a first via contact 24, 0.1 μm in diameter, for electrically connecting this second interconnect layer 26 and the first interconnect layer 16. Here, as a low-k film having a specific permittivity "k" of 3.5 or lower to serve as the third insulating film 21, there was used an insulating film formed using a CVD method and having an SiOC-based composition and a specific permittivity "k" of 3. An inorganic material consisting primarily of SiOF or SiOCH or an organic material consisting primarily of polyarylether (PAr) may be used in place of SiOC.

Note that the first via contact 24 and the second interconnect layer 26 have a dual damascene interconnect structure. That is, copper 22 is buried in an interconnect trench and a via hole at one time by a plating method using a film of a Ta-based barrier metal 23 and a copper seed film formed by a sputtering method. After this, the barrier metal and the copper in the field section are removed using a CMP method to form the first via contact 24 and the second interconnect layer 26. As an electrical conductor, tungsten (W), aluminum (Al) or tin (Sn) may be used in place of copper (Cu).

FIG. 1F illustrates a cross-sectional view of a chip after the electrical conductors (barrier metal and copper) in the field section are removed.

Figure 1G:
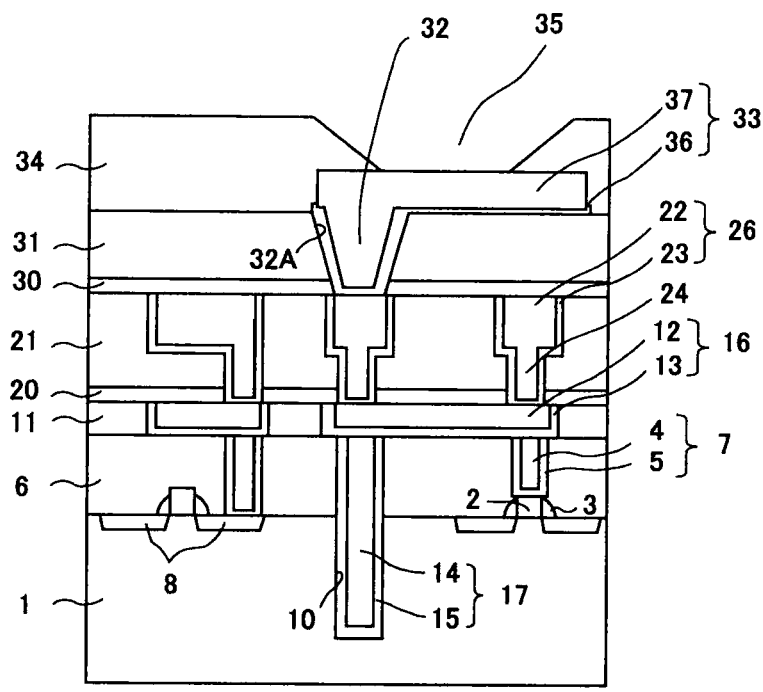
FIG. 1G is a cross-sectional view illustrating a manufacturing step following the manufacturing step of the semiconductor chip in accordance with the first embodiment illustrated in FIG. 1F.

(9) Next, as shown in FIG. 1G, a second cap insulating layer 30 having a film thickness of 0.05 μm is formed on the third insulating film 21. This second cap insulating layer 30 prevents the copper 22 of the second interconnect layer 26 from diffusing into a later-described fourth insulating film 31 due to heat. This second cap insulating layer 30 is composed of SiN, SiC, SiCN, or the like.

(10) Next, as shown in FIG. 1G, a fourth insulating film 31 having a specific permittivity "k" of 4 or higher is formed on this second cap insulating layer 30. After that, this fourth insulating film 31 is patterned with a contact hole 32A (approximately 1 μm in diameter) for an uppermost-layer via contact 32 using a lithography method, and then the contact hole 32A is processed and formed using an RIE method.

(11) Next, as shown in FIG. 1G, a Ti-based barrier metal 36 and aluminum 37 are film-formed in the contact hole 32A of this uppermost-layer via contact 32 and in the field section. This barrier metal 36 and the aluminum 37 are subjected to patterning using a lithography method, and then processed using an RIE method, thereby forming an uppermost-layer interconnect 33 having a line/space ratio of 1 μm/1 μm.

(12) Next, as shown in FIG. 1G, a fifth insulating film 34 having a specific permittivity "k" of 4 or higher is formed on the fourth insulating film 31 as a passivation film. After this, a terminal via hole 35 (approximately 60 μm$^2$ in area) is created in this fifth insulating film 34 using a lithography method and an RIE method. A portion of the uppermost-layer interconnect 33 exposed on the bottom face of this terminal via hole 35 functions as an electrode (first electrode).

Figure 1H:
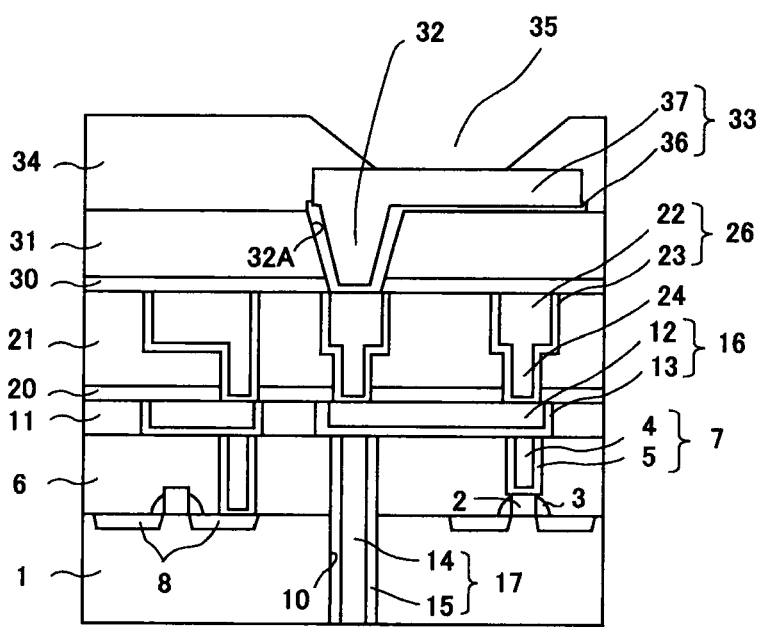
FIG. 1H is a cross-sectional view illustrating a manufacturing step following the manufacturing step of the semiconductor chip in accordance with the first embodiment illustrated in FIG. 1G.

(13) Next, as shown in FIG. 1H, the rear surface side of the Si substrate 1 (side opposite to the terminal via hole 35) is abraded to a thickness of 50 μm, thereby exposing the through-substrate contact plug 17 on the rear surface of the Si substrate 1.

Figure 1I:
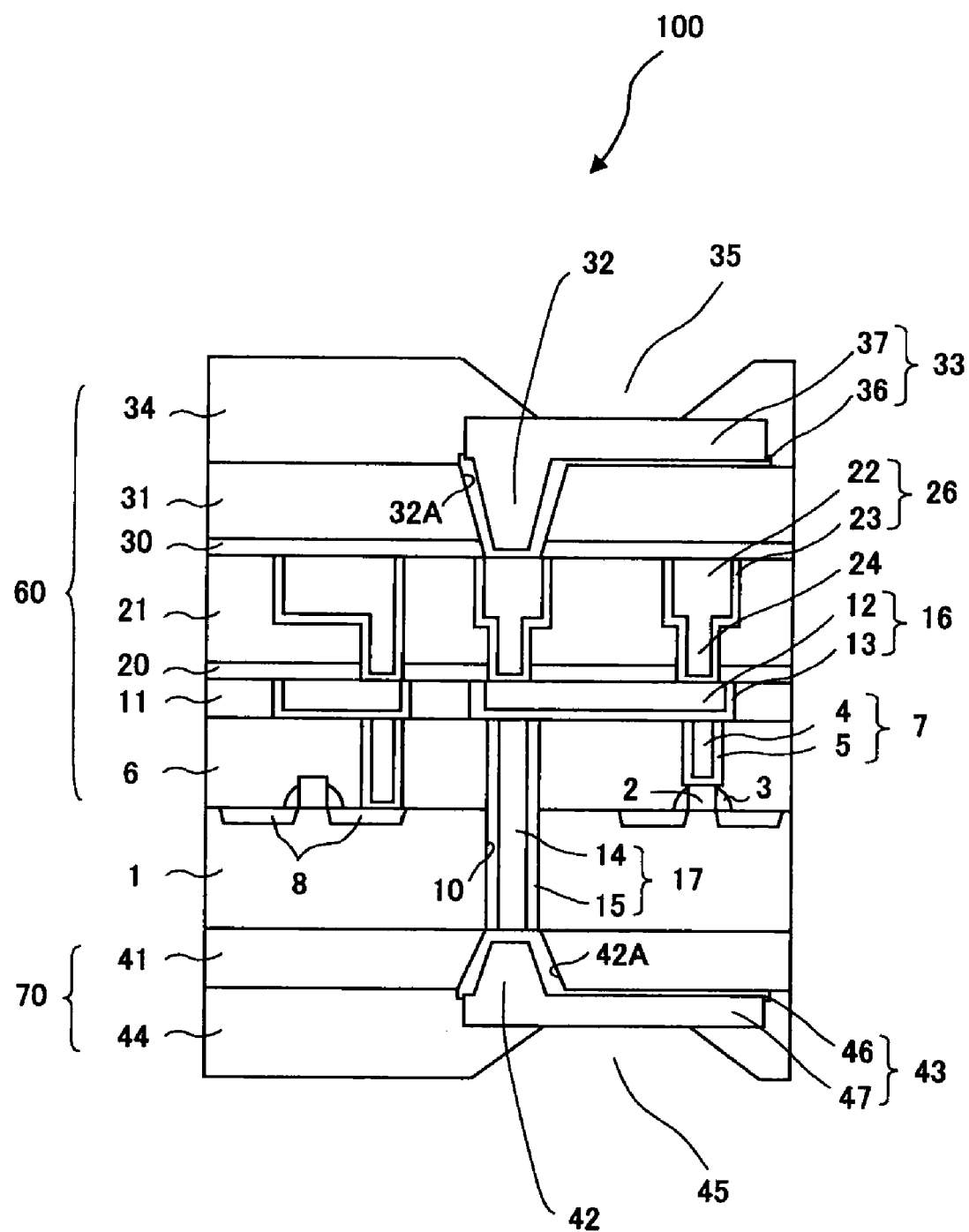
FIG. 1I is a cross-sectional view illustrating a manufacturing step following the manufacturing step of the semiconductor chip in accordance with the first embodiment illustrated in FIG. 1H.

(14) Next, as shown in FIG. 1I, a sixth insulating film 41 having a thickness of 0.3 μm is formed on the rear surface side of the Si substrate 1. Then, after patterning this sixth insulating film 41 with a contact hole 42A (approximately 1 μm in diameter) for a rear-surface via contact 42 using a lithography method, the contact hole 42A is processed and formed using an RIE method.

(15) Next, as shown in FIG. 1I, a Ti-based barrier metal 46 and aluminum 47 are film-formed in the contact hole 42A of this rear-surface via contact 42 and in the field section. Next, this barrier metal 46 and the aluminum 47 are subjected to patterning using a lithography method, and then processed using an RIE method, thereby forming a rear-surface interconnect 43 having a line/space ratio of 1 μm/1 μm.

(16) Next, as shown in FIG. 1I, a seventh insulating film 44 having a specific permittivity "k" of 4 or higher is formed on the sixth insulating film 41 as a passivation film. After this, this seventh insulating film 44 is processed using a lithography method and an RIE method to create a rear-surface terminal via hole 45 (approximately 60 μm$^2$ in area). The rear surface interconnect 43 exposed on the bottom face of this rear-surface terminal via hole 45 functions as an electrode (second electrode).

FIG. 1I illustrates a cross-section of a semiconductor chip 100 after the rear-surface terminal via hole 45 is created.

Second Embodiment

Figure 1J:
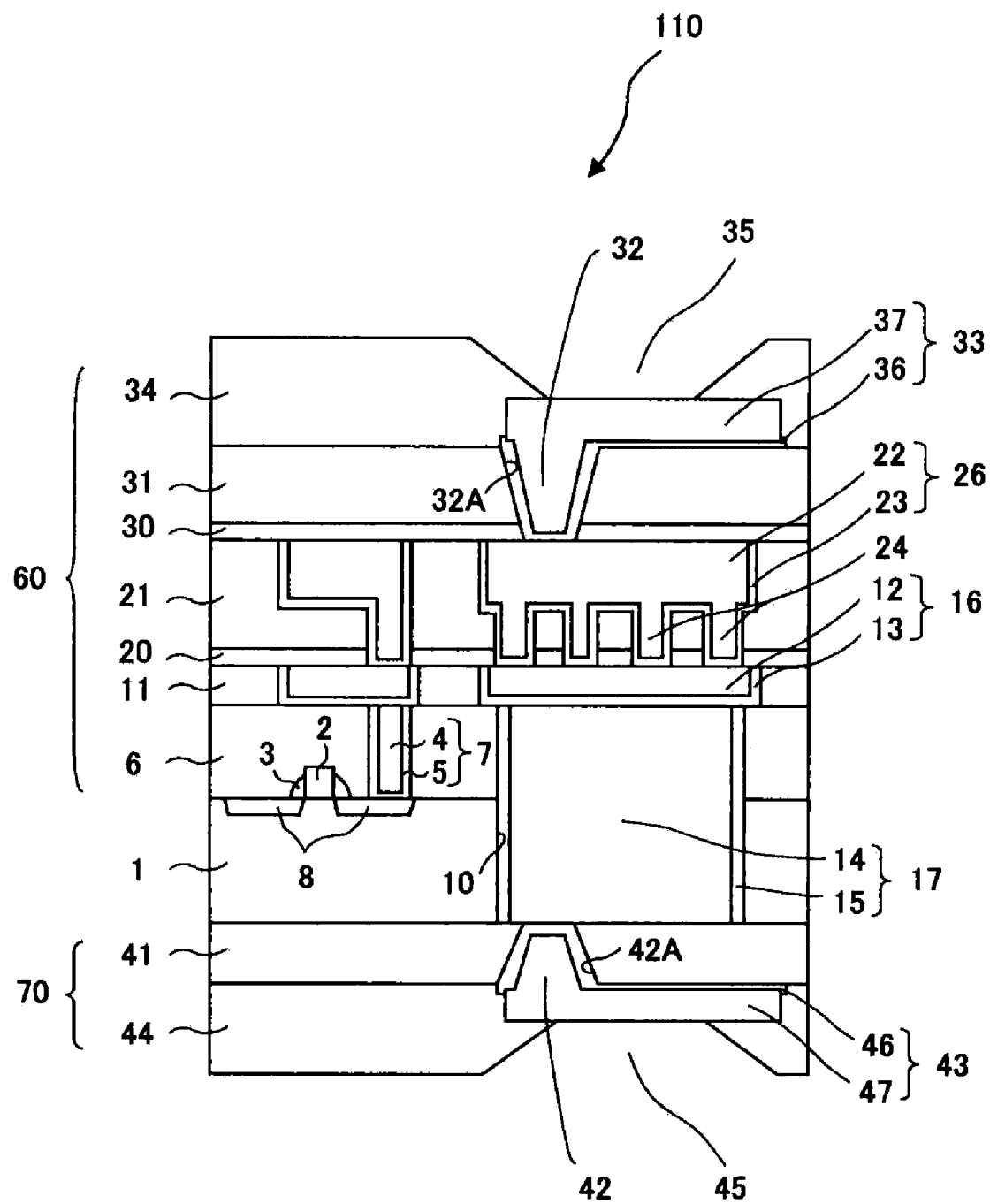
FIG. 1J is a cross-sectional view used to explain a manufacturing step of a semiconductor chip in accordance with a second embodiment.

FIG. 1J is a cross-sectional view of a semiconductor chip 110 in accordance with a second embodiment. The difference of the second embodiment from the first embodiment is that as is understood from FIG. 1J, there are a plurality of first via contacts 24 (four in FIG. 1J for electrically connecting a first electrode (uppermost-layer interconnect 33 exposed on the bottom face of the terminal via hole 35) formed on the upper surface of the semiconductor chip 110 and the through-substrate contact plug 17.

Consequently, even when a first via contact 24 having a small diameter is used, it is possible to further reduce resistance between a through-substrate contact plug 17 having a large diameter and a second interconnect layer 26. It is therefore possible to flow an even larger current through the through-substrate contact plug 17.

A description has heretofore been made of the semiconductor chips 100 and 110 in accordance with the first and second embodiments of the present invention. In these semiconductor chips 100 and 110, it is possible to use tungsten (W), copper (Cu), aluminum (Al) or tin (Sn) commonly used as an interconnect material, as the through-substrate contact metal 14. This is because there are no high-temperature processes (for example, the formation of a gate oxide film or the activation of an impurity in a diffusion layer) that may accompany such a step as the fabrication of a MOS-FET after the burial of the through-substrate contact metal 14. Accordingly, there is obtained the advantage that the contact resistance of the through-substrate contact plug 17 in accordance with the first and second embodiments is lower, compared, for example, with a case in which poly-Si or the like is used for the through-substrate contact metal 14.

Another advantage is that the second insulating film 11 and the third insulating film 21 do not suffer processing damage that may be caused by an $SF_6$-based gas or a $C_4F_8$-based gas used to process the through-substrate contact hole 10. This is because the second insulating film 11 and the third insulating film 21, which are low-k films, are not processed when forming the through-substrate contact hole 10. Consequently, the above-described problem that may arise as a low-k film changes in quality is eliminated. Thus, it is possible to provide a semiconductor chip superior in the contact property of the through-substrate contact plug 17 and in the heat resistance of various interconnects.

Note that neither electromigration (EM) nor stress migration (SM) was observed in the through-substrate contact plug 17 of the first and second embodiments. The reliability of the through-substrate contact plug 17 has thus been confirmed.

As described above, the embodiments of the present invention are devised so as to prevent processing damage to the low-k film that may occur when forming the through-substrate contact hole, by providing a low-k film having an interconnect layer above the through-substrate contact plug. Consequently, in a semiconductor chip (semiconductor device) having a low-k film, it is possible to form a highly-reliable through-substrate contact plug free from cutoff and the like.

Note that in the above-described embodiment, a case has been described in which the semiconductor chip includes two interconnect layers (first interconnect layer 16 and second interconnect layer 26). Alternatively, the semiconductor chip may include only one interconnect layer or three or more interconnect layers.

Figure 2:
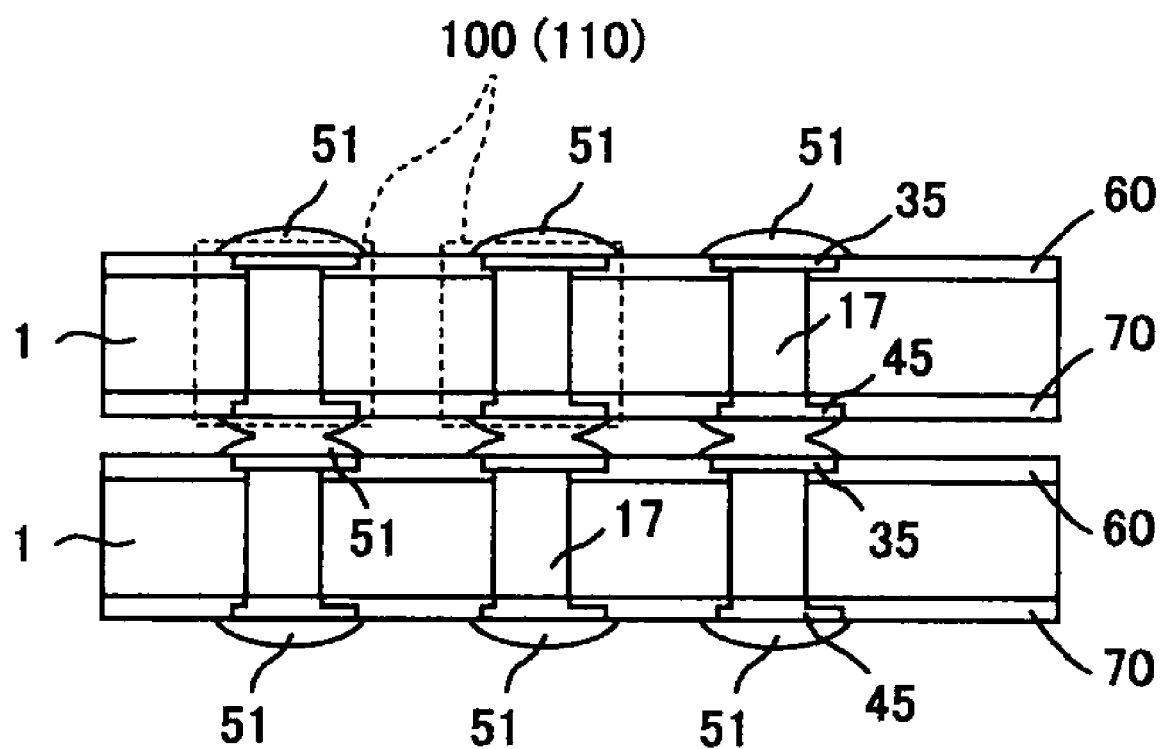
FIG. 2 is a cross-sectional view of stacked two semiconductor chips.

Next, using FIG. 2, an explanation will be made of a method for stacking two semiconductor chips 100 (110) by bonding the bump electrodes thereof to one another, without using bonding wires. FIG. 2 illustrates a condition in which there are stacked two chips obtained by dicing a wafer after performing the above-described process thereon. A front-surface multilayer film 60 denotes a multilayer film (first insulating film 6 to fifth insulating film 34) formed on the front surface side of the Si substrate 1. A rear-surface multilayer film 70 denotes a multilayer film (sixth insulating film 41 and seventh insulating film 44) formed on the rear surface side of the Si substrate 1.

First, bump electrodes 51 are formed on a terminal via hole 35 and a rear-surface terminal via hole 45 in a wafer. As these bump electrodes 51, gold (Au), copper (Cu), tin (Sn) or the like is used.

Next, this wafer is diced into semiconductor chips. Then, as is understood from FIG. 2, these individual chips are stacked so that the bump electrodes 51 of upper and lower chips are bonded to one another. After that, the metal of the bump electrodes 51 is heated and melted so that the bump electrodes 51 are fixed to one another. In this way, there are obtained stacked semiconductor chips (stacked semiconductor device) in which a plurality of semiconductor chips is stacked.

Next, an explanation will be made of two comparative examples 1 and 2 of which the inventor of the present invention has the knowledge, in order to show the advantages of the above-described first and second embodiments.

As one of differences between these comparative examples and the embodiments (first and second embodiments) in accordance with the present invention, there is mentioned the extent to which the through-substrate contact plug 17 penetrates, as is understood from comparison among FIGS. 1I, 1J, 3H and 4H. That is, the through-substrate contact plug 17 of the first and second embodiments penetrates through the Si substrate 1 and the first insulating film 6, as described above. In contrast, the through-substrate contact plug 17 penetrates through only the Si substrate 1 in comparative example 1, and penetrates from the Si substrate 1 through to the fourth insulating film 31 in comparative example 2.

Comparative Example 1

Now, comparative example 1 will be explained.

FIG. 3A to FIG. 3H are cross-sectional process drawings illustrating a manufacturing method of comparative example 1.

(1) First, an Si substrate 1 is processed using an RIE method to form a through-substrate contact hole 10. When processing the Si substrate 1, the Si substrate 1 is processed to a depth partway therethrough, as is understood from FIG. 3A. That is, the Si substrate 1 is processed to a depth of 50 μm from the front surface thereof by specifying a processing time derived from a processing speed. As a specific method, a resist mask (10 μm in film thickness) patterned with a hole 20 μm in diameter is formed using a photolithography method, and then the Si substrate 1 is processed using an $SF_6$-based gas.

Note that the $SF_6$-based gas has a high processing selection ratio between Si and $SiO_2$. Accordingly, a 0.5 μm-thick film of $SiO_2$ may be formed on the Si substrate 1, and then this $SiO_2$ film may be used as a hard mask when processing the Si substrate 1. In this case, however, the $SiO_2$ film serving as the hard mask must be removed after forming the through-substrate contact plug 17, in order to form a MOS-FET.

(2) Next, using a plasma CVD method, a contact sidewall insulating film 15 made of $SiO_2$ is formed in the through-substrate contact hole 10 processed to a depth partway through the Si substrate 1. After that, a through-substrate contact metal 14 to serve as an electrical conductor is buried in the through-substrate contact hole 10. For this through-substrate contact metal 14, poly-Si is used rather than tungsten (W), aluminum (Al), copper (Cu) or tin (Sn), taking into consideration thermal history associated with the fabrication of a MOS-FET to be fabricated later. This poly-Si is film-formed and buried using an LP-CVD method. After that, an electrical conductor (poly-Si) in a field section is removed using a CMP method to form a through-substrate contact plug 17.

Figure 3A:
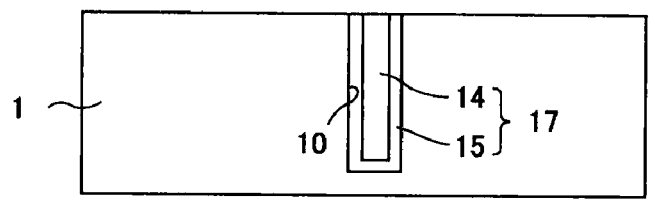
FIG. 3A is a cross-sectional view illustrating a manufacturing step of a semiconductor chip in accordance with comparative example 1.

FIG. 3A illustrates a cross-sectional view of a chip after the electrical conductor in the field section is removed.

Figure 3B:
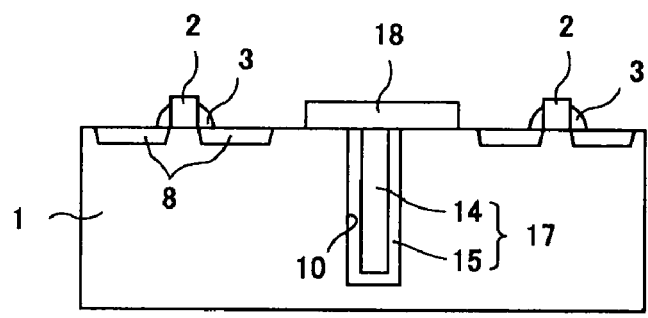
FIG. 3B is a cross-sectional view illustrating a manufacturing step following the manufacturing step of the semiconductor chip in accordance with comparative example 1 illustrated in FIG. 3A.

(3) Next, as shown in FIG. 3B, gate interconnects 2, sidewall insulating films 3, sources/drains 8, element-isolating regions (not illustrated) and the like are formed to fabricate the MOS-FET. In addition, a pad 18 made of poly-Si is formed on the through-substrate contact plug 17 when film-forming poly-Si for the gate interconnect 2. This pad 18 functions as an electrode for electrically connecting the through-substrate contact plug 17 and a contact plug 7 (described later).

Figure 3C:
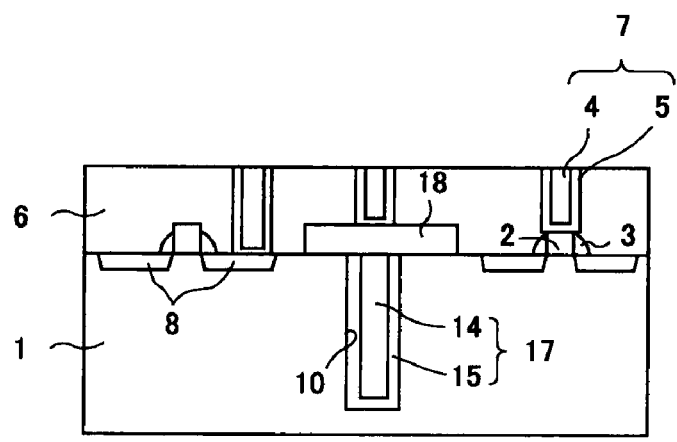
FIG. 3C is a cross-sectional view illustrating a manufacturing step following the manufacturing step of the semiconductor chip in accordance with comparative example 1 illustrated in FIG. 3B.

(4) Next, as shown in FIG. 3C, a first insulating film 6 having a thickness of 0.5 μm and a specific permittivity "k" of 4 or higher is formed on the MOS-FET. After this, there is formed a contact plug 7 for connecting a later-described first interconnect layer 16 and the MOS-FET. At this time, as is understood from FIG. 3C, contact plugs 7 are formed with the pad 18 on the through-substrate contact plug 17 positioned therebetween. The contact plugs 7 may be formed directly on the through-substrate contact plug 17 without the pad 18 being positioned therebetween (not illustrated).

Figure 3D:
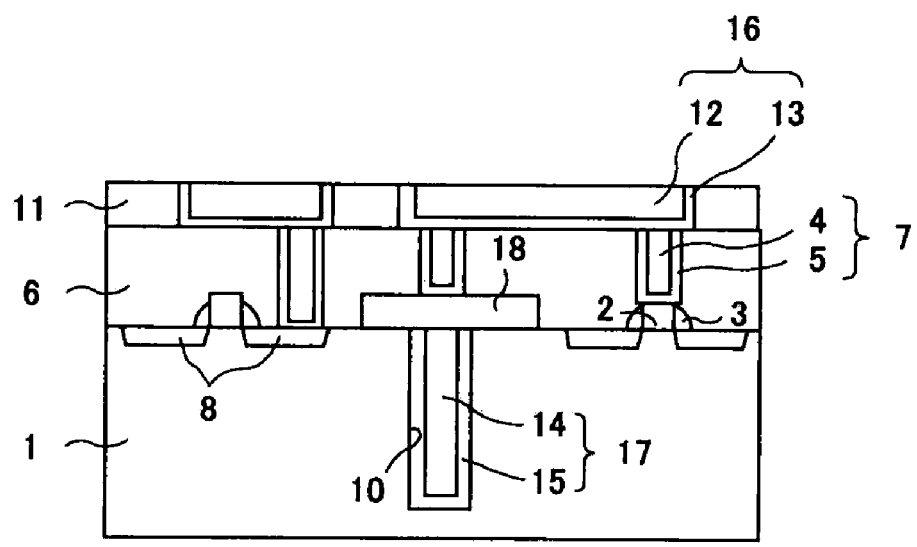
FIG. 3D is a cross-sectional view illustrating a manufacturing step following the manufacturing step of the semiconductor chip in accordance with comparative example 1 illustrated in FIG. 3C.
Figure 3E:
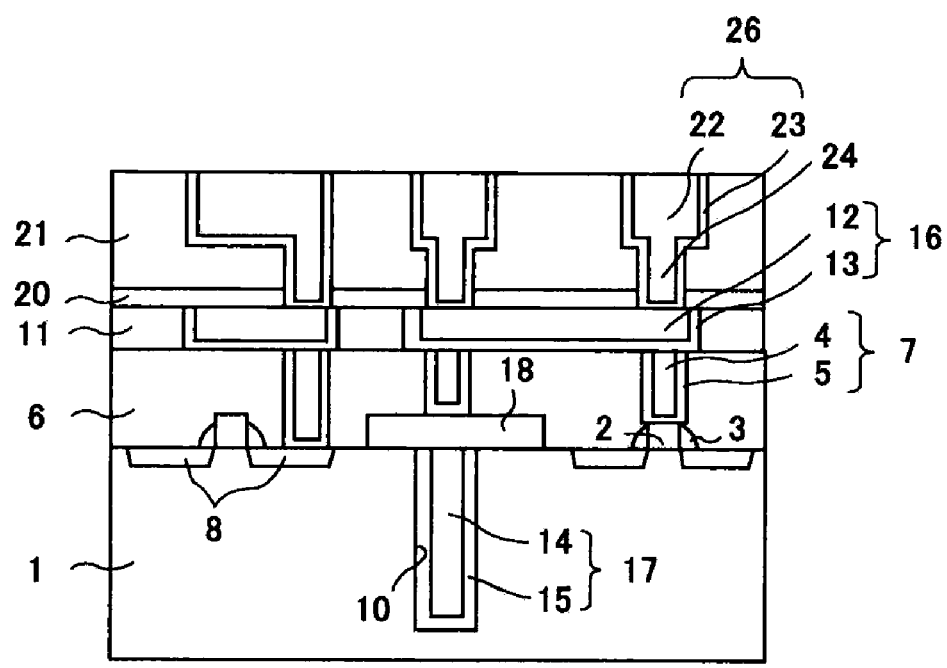
FIG. 3E is a cross-sectional view illustrating a manufacturing step following the manufacturing step of the semiconductor chip in accordance with comparative example 1 illustrated in FIG. 3D.
Figure 3F:
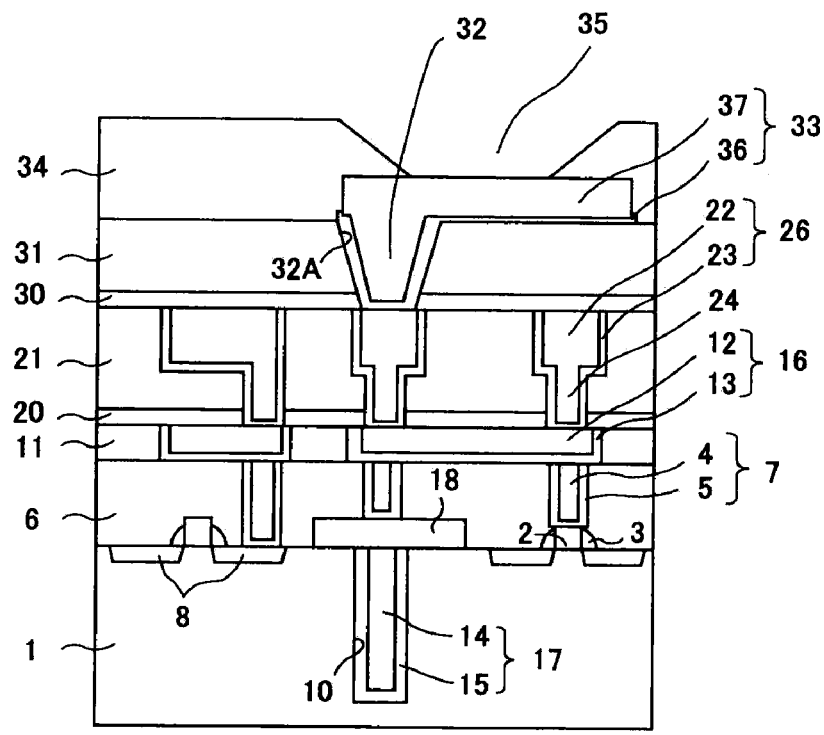
FIG. 3F is a cross-sectional view illustrating a manufacturing step following the manufacturing step of the semiconductor chip in accordance with comparative example 1 illustrated in FIG. 3E.
Figure 3G:
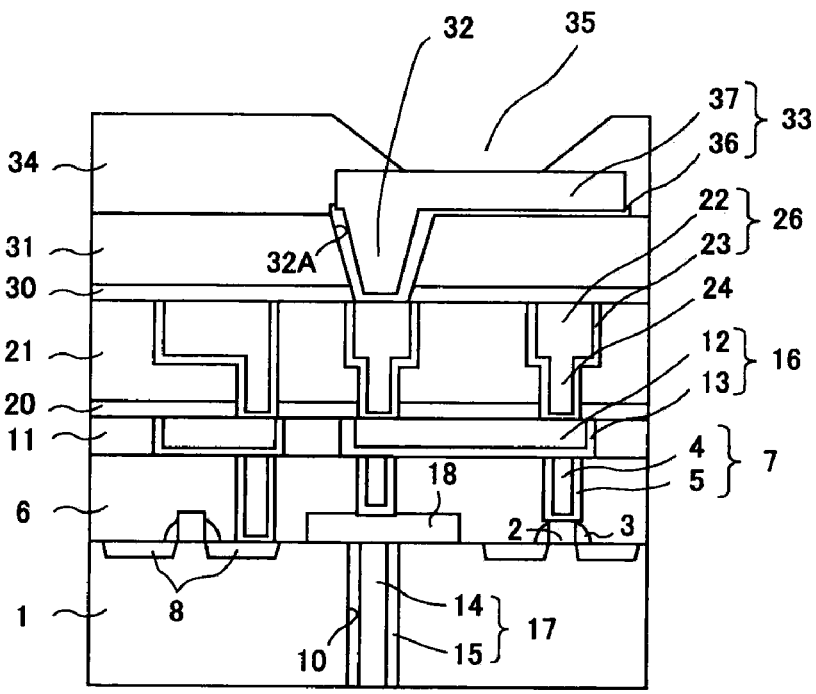
FIG. 3G is a cross-sectional view illustrating a manufacturing step following the manufacturing step of the semiconductor chip in accordance with comparative example 1 illustrated in FIG. 3F.
Figure 3H:
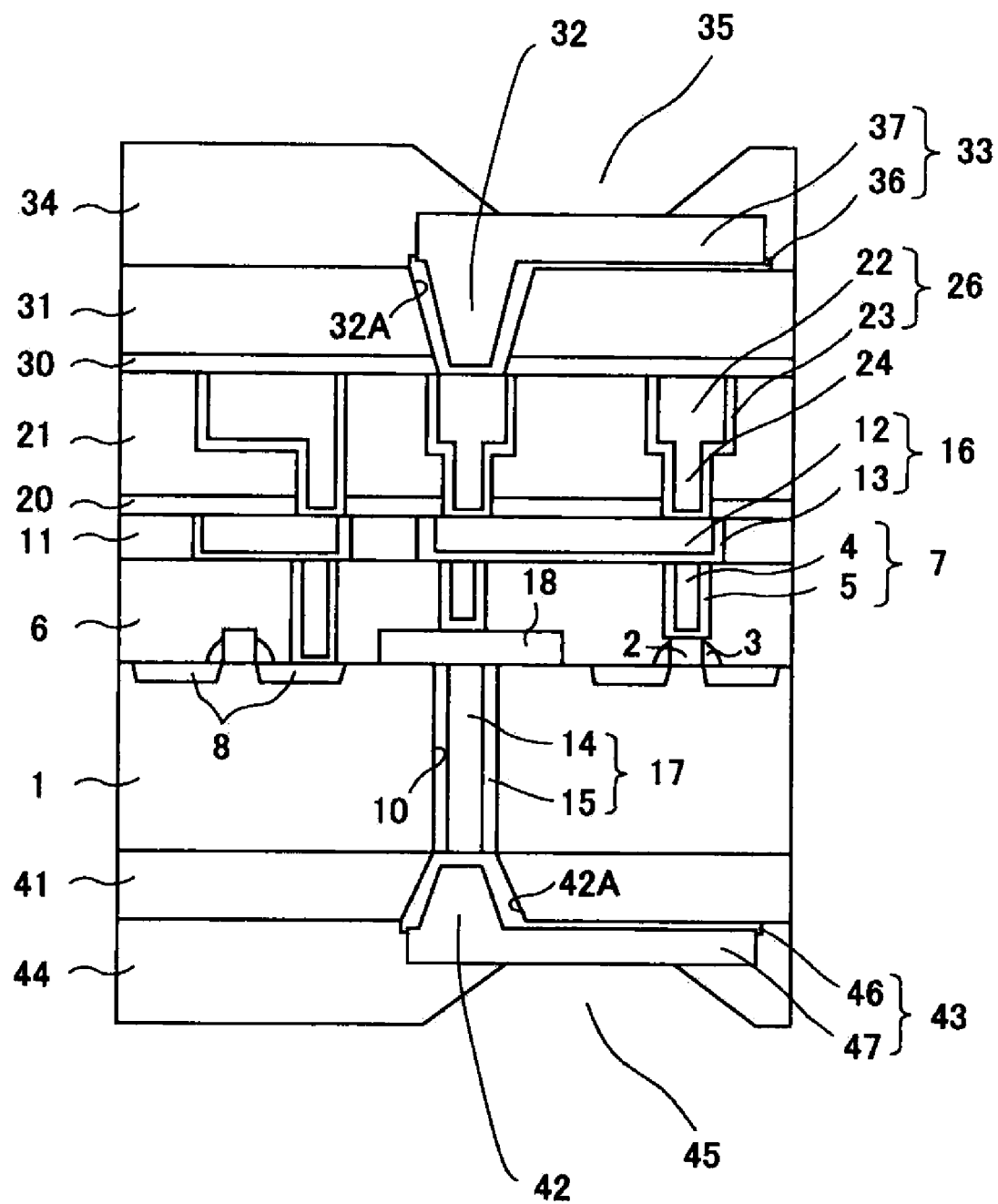
FIG. 3H is a cross-sectional view illustrating a manufacturing step following the manufacturing step of the semiconductor chip in accordance with comparative example 1 illustrated in FIG. 3G.

(5) Next, as shown in FIG. 3D, a second insulating film 11 is formed on the first insulating film 6. This second insulating film 11 is a low-k film having a thickness of 0.5 μm and a specific permittivity "k" of 3.5 or lower. Next, a resist film (not illustrated) is formed on this second insulating film 11 to form an interconnect pattern having a line/space ratio of 0.1 μm/0.1 μm using a lithography method. After that, the second insulating film 11 is processed along this interconnect pattern using an RIE method to form a trench. Next, a Ta-based barrier metal 13A (not illustrated) is film-formed on the surface of this trench using a sputtering method. By a plating method using this barrier metal 13A and a seed film made of copper, copper 12A (not illustrated) is buried in the trench. After that, the barrier metal 13A and the copper 12A in the field section are removed using a CMP method to form the first interconnect layer 16 made of a barrier metal 13 and copper 12.

FIG. 3D illustrates a cross-section of a semiconductor chip after the first interconnect layer 16 is formed. Here, as the second insulating film 11 having a specific permittivity "k" of 3.5 or lower, there was used an insulating film formed using a CVD method and having an SiOC-based composition and a specific permittivity "k" of 3.

The subsequent steps illustrated in FIGS. 3E to 3H are the same as those of the first embodiment and, therefore, will not be explained again.

In the method of this comparative example 1, it is difficult to use tungsten (W), copper (Cu), aluminum (Al) or tin (Sn) commonly used as an interconnect material, as the through-substrate contact metal 14. This is because if copper, aluminum or tin is used as an electrical conductor, the metal will melt when exposed to an intense heat of 1000° C. or higher in a process of fabricating the MOS-FET. Thus, it is not possible to form the through-substrate contact plug 17.

If tungsten is used as the electrical conductor, the surface resistances of tungsten and the gate interconnect 2 increase. This is because the surface of the through-substrate contact plug 17 remains exposed until the pad 18 is formed and, therefore, the exposed surface of tungsten oxidizes when forming a gate oxide film prior to fabricating the pad 18. This results in the formation of an oxide (WOx).

Hence, in the case of comparative example 1, a material preferred as the through-substrate contact metal 14 is concluded to be poly-Si. However, poly-Si has a specific resistance higher than those of metals (W, Cu, Al and Sn) used in the first and second embodiments, thus causing a contact resistance to become higher. This is particularly problematic when miniaturizing the through-substrate contact plug 17.

Comparative Example 2

Next, comparative example 2 will be explained.

FIGS. 4A to 4H are cross-sectional process drawings illustrating a manufacturing method of comparative example 2.

Figure 4A:
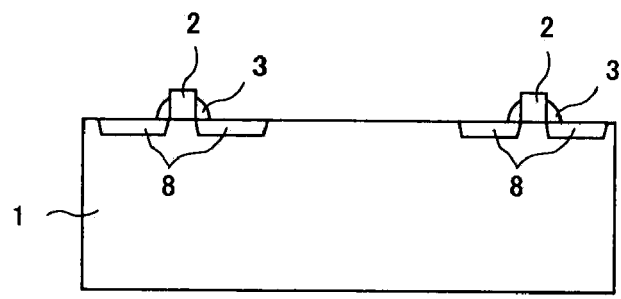
FIG. 4A is a cross-sectional view illustrating a manufacturing step of a semiconductor chip in accordance with comparative example 2.

(1) First, as shown in FIG. 4A, gate interconnects 2, sidewall insulating films 3, sources/drains 8, element-isolating regions (not illustrated) and the like are formed on an Si substrate 1 to fabricate a MOS-FET.

Figure 4B:
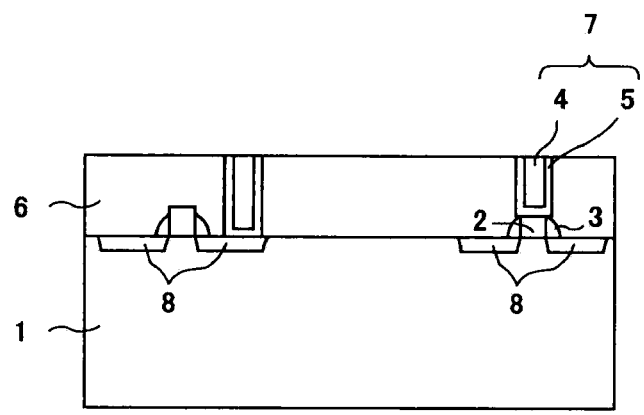
FIG. 4B is a cross-sectional view illustrating a manufacturing step following the manufacturing step of the semiconductor chip in accordance with comparative example 2 illustrated in FIG. 4A.

(2) Next, as shown in FIG. 4B, a first insulating film 6 having a thickness of 0.5 μm and a specific permittivity "k" of 4 or higher is formed on the MOS-FET. After this, there is formed a contact plug 7 for connecting a later-described first interconnect layer 16 and the MOS-FET.

Figure 4C:
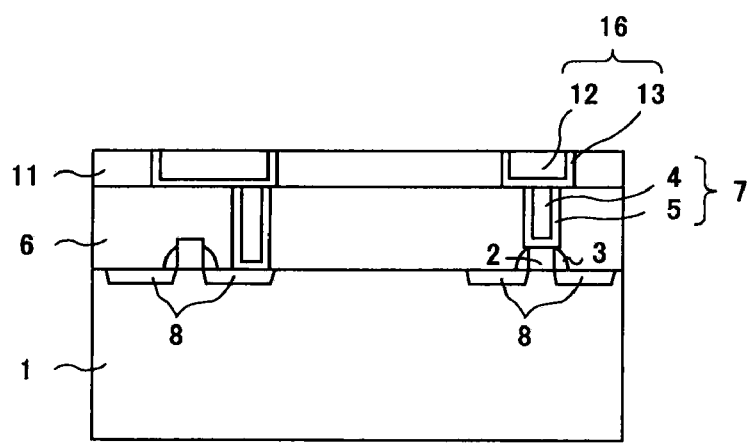
FIG. 4C is a cross-sectional view illustrating a manufacturing step following the manufacturing step of the semiconductor chip in accordance with comparative example 2 illustrated in FIG. 4B.

(3) Next, as shown in FIG. 4C, a second insulating film 11 is formed on the first insulating film 6. This second insulating film 11 is a low-k film having a thickness of 0.5 μm and a specific permittivity "k" of 3.5 or lower. Next, a resist film (not illustrated) is formed on this second insulating film 11 and an interconnect pattern having a line/space ratio of 0.1 μm/0.1 μm is formed using a lithography method. After that, the second insulating film 11 is processed along this interconnect pattern using an RIE method to form a trench. Next, a Ta-based barrier metal 13A (not illustrated) is film-formed on the surface of this trench using a sputtering method. By a plating method using this barrier metal 13A and a seed film made of copper, copper 12A (not illustrated) is buried in the trench. After that, the barrier metal 13A and the copper 12A in a field section are removed using a CMP method to form a first interconnect layer 16 made of a barrier metal 13 and copper 12. Here, as the second insulating film 11 having a specific permittivity "k" of 3.5 or lower, there was used an insulating film formed using a CVD method and having an SiOC-based composition and a specific permittivity "k" of 3.

FIG. 4C illustrates a cross-sectional view of a chip after the first interconnect layer 16 is formed.

Figure 4D:
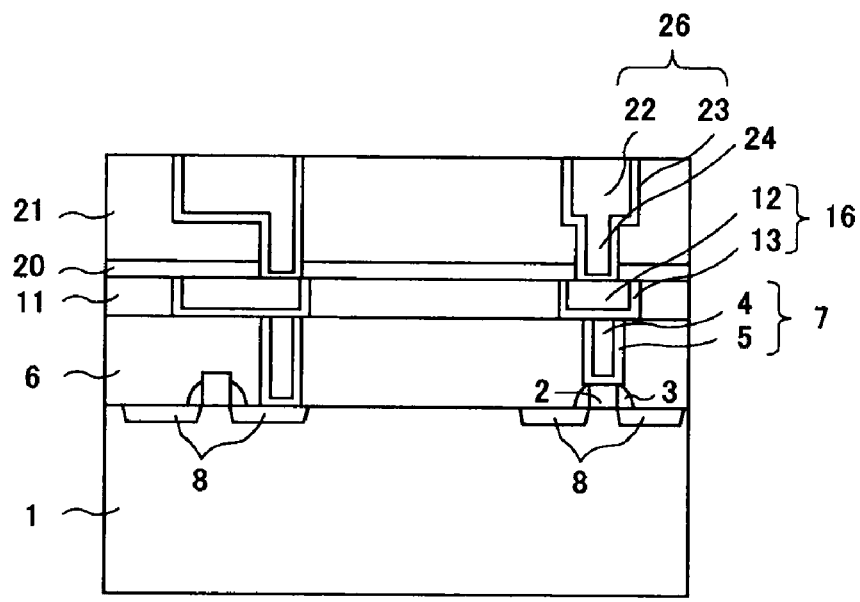
FIG. 4D is a cross-sectional view illustrating a manufacturing step following the manufacturing step of the semiconductor chip in accordance with comparative example 2 illustrated in FIG. 4C.

(4) Next, as shown in FIG. 4D, a first cap insulating layer 20 having a thickness of 0.05 μm and an SiCN composition is formed on the second insulating film 11.

(5) Next, as shown in FIG. 4D, a third insulating film 21 (low-k film) having a thickness 1 μm is formed on the first cap insulating layer 20. After that, there are formed a second interconnect layer 26 having a line/space ratio of 0.1 μm/0.1 μm and a first via contact 24, 0.1 μm in diameter, for electrically connecting the second interconnect layer 26 and the first interconnect layer 16.

Here, as a low-k film having a specific permittivity "k" of 3.5 or lower for the third insulating film 21, there was used an insulating film formed using a CVD method and having an SiOC-based composition and a specific permittivity "k" of 3.

Note that the first via contact 24 and the second interconnect layer 26 have a dual-damascene interconnect structure. That is, copper 22 is buried in an interconnect trench and a via hole at one time by a plating method, using a film of a Ta-based barrier metal 23 and a seed film made of copper formed by a sputtering method. After this, the barrier metal and the copper in the field section are removed using a CMP method to form the first via contact 24 and the second interconnect layer 26.

FIG. 4D illustrates a cross-sectional view of a chip after the electrical conductors (barrier metal and copper) in the field section are removed.

Figure 4E:
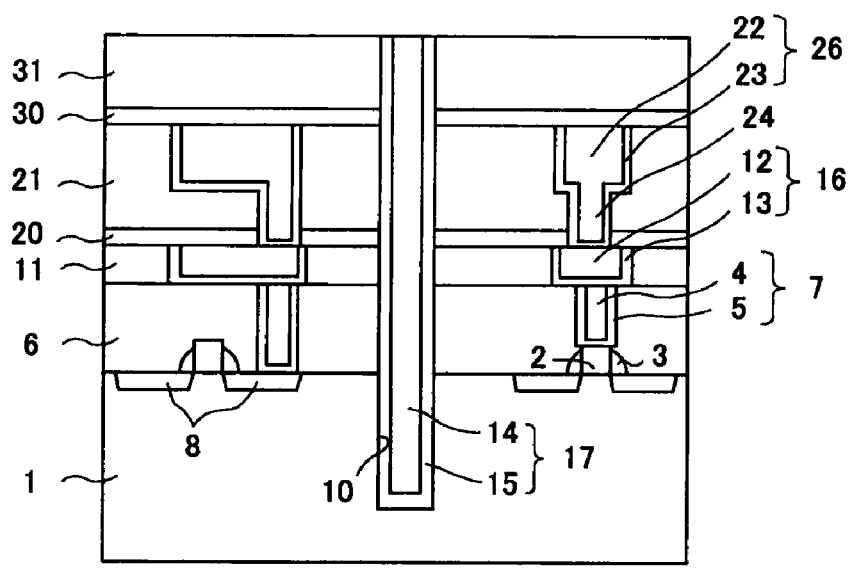
FIG. 4E is a cross-sectional view illustrating a manufacturing step following the manufacturing step of the semiconductor chip in accordance with comparative example 2 illustrated in FIG. 4D.

(6) Next, as shown in FIG. 4E, a second cap insulating layer 30 having a thickness of 0.05 μm and an SiN composition is formed on the third insulating film 21.

(7) Next, as shown in FIG. 4E, a fourth insulating film 31 having a specific permittivity "k" of 4 or higher is formed on the second cap insulating layer 30. After that, using a resist mask film-formed on this fourth insulating film 31 and patterned with a hole 20 μm in diameter by a photolithography method, a through-substrate contact hole 10 penetrating from the fourth insulating film 31 through to the Si substrate 1 is processed using an RIE method. At this time, as is understood from FIG. 4E, the through-substrate contact hole 10 is processed to a depth partway through the Si substrate 1. That is, the through-substrate contact hole 10 is processed to a position 50 μm deep from the front surface of the Si substrate 1 by specifying a processing time derived from a processing speed. Note here that it is impossible to simultaneously perform processing from the fourth insulating film 31 made of $SiO_2$ through to the Si substrate 1. Therefore, the fourth insulating film 31 having a specific permittivity "k" of 4 or higher and composed of $SiO_2$ and the second cap insulating layer 30 are first processed using a $C_4F_8$-based gas. Then, the third insulating film 21 made of SiOC, the first cap insulating layer 20 made of SiCN and the second insulating film 11 are processed using a $CF_4$-based gas. Subsequently, the first insulating film 6 made of $SiO_2$ is processed using a $C_4F_8$-based gas. After that, the Si substrate 1 is processed using an $SF_6$-based gas. Finally, the resist and processing residues are removed using an ammonia fluoride-based separating liquid.

The observation of the sidewall of the through-substrate contact hole 10 processed as described above showed that a portion of the second insulating film 11 and the third insulating film 21, which are low-k films and composed of SiOC, were in a recessed shape. This is because SiOC in a portion corresponding to the low-k film, among the portions of the sidewall of the through-substrate contact hole 10, changed in quality since the $C_4F_8$-based gas and the $SF_6$-based gas were used respectively when processing the first insulating film 6 and the Si substrate 1. Thus, the altered portion was subsequently removed by the ammonia fluoride-based separating liquid. In order to avoid such a phenomenon as described above, the first insulating film 6 was processed using a $CF_4$-based gas under which SiOC was less liable to change in quality. However, this process took a prolonged period of time since the processing speed was low, thus proving to be not practical.

(8) Next, as shown in FIG. 4E, a contact sidewall insulating film 15 made of $SiO_2$ is formed in the through-substrate contact hole 10 processed to a depth partway through the Si substrate 1 using a plasma CVD method. Then, a through-substrate contact metal 14 serving as an electrical conductor is buried in the through-substrate contact hole 10.

The burial of this through-substrate contact metal 14 is achieved by film-forming a Ti-based barrier metal (not illustrated) on the contact sidewall insulating film 15 using a sputtering method or a CVD method, and then film-forming tungsten (W) using a CVD method. After this, electrical conductors (barrier metal and tungsten) in a field section are removed using a CMP method to form a through-substrate contact plug 17.

As another method for burying the through-substrate contact metal 14, there may be used a method for burying copper (Cu) in the through-substrate contact hole 10 using a plating method, and then removing the electrical conductors in the field section using a CMP method.

Figure 4F:
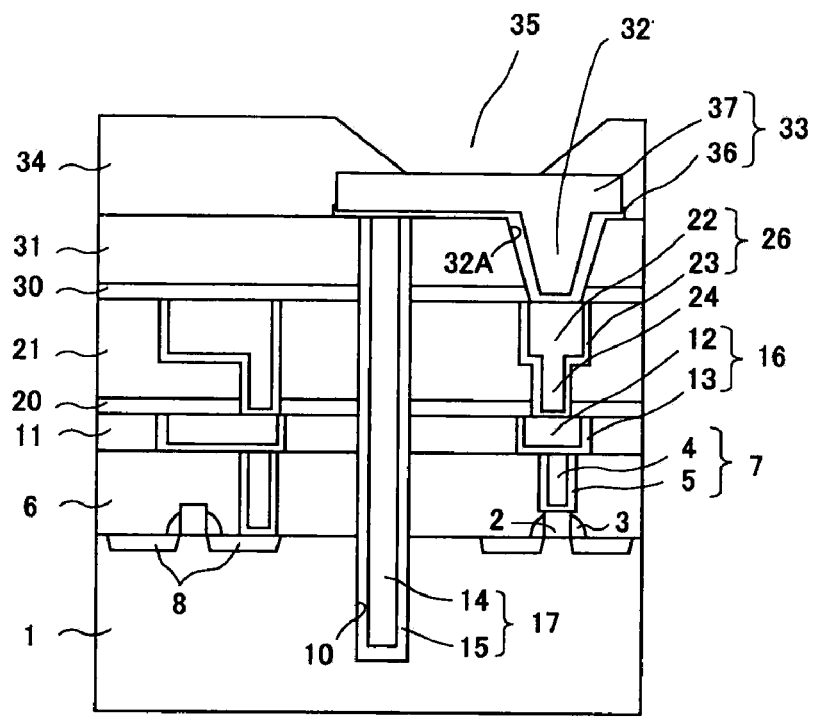
FIG. 4F is a cross-sectional view illustrating a manufacturing step following the manufacturing step of the semiconductor chip in accordance with comparative example 2 illustrated in FIG. 4E.

(9) Next, as shown in FIG. 4F, the fourth insulating film 31 is patterned with a contact hole 32A (1 μm in diameter) for an uppermost-layer via contact 32 using a lithography method, and then the contact hole 32A is processed and formed using an RIE method.

(10) Next, as shown in FIG. 4F, a Ti-based barrier metal 36 and aluminum 37 are film-formed in the contact hole 32A of the uppermost-layer via contact 32 and in the field section. These barrier metal 36 and aluminum 37 are patterned using a lithography method, and then processed using an RIE method to form an uppermost-layer interconnect 33 having a line/space ratio of 1 μm/1 μm.

(11) Next, as shown in FIG. 4F, a fifth insulating film 34 having a specific permittivity "k" of 4 or higher is formed on the fourth insulating film 31 as a passivation film. After this, a terminal via hole 35 (60 μm$^2$ in area) is created in this fifth insulating film 34 using a lithography method and an RIE method.

Figure 4G:
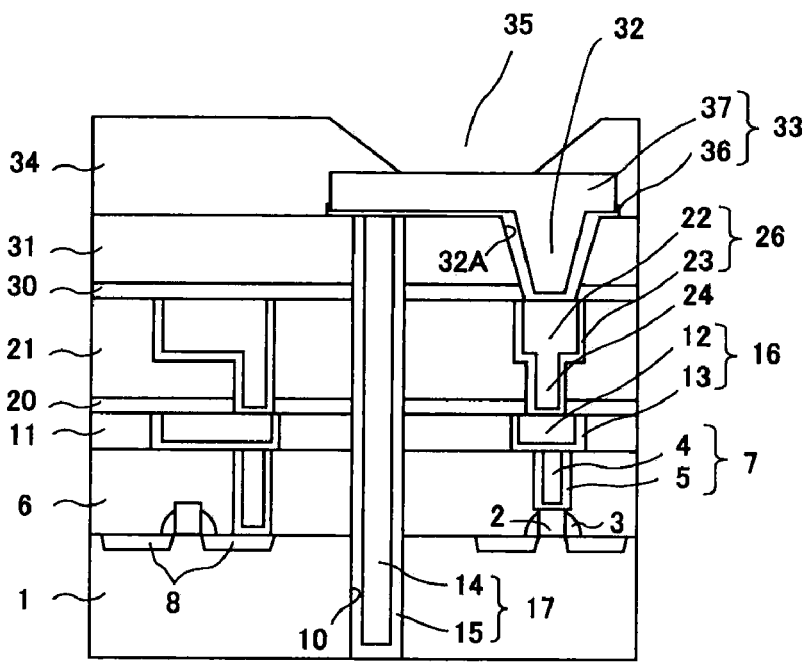
FIG. 4G is a cross-sectional view illustrating a manufacturing step following the manufacturing step of the semiconductor chip in accordance with comparative example 2 illustrated in FIG. 4F.
Figure 4H:
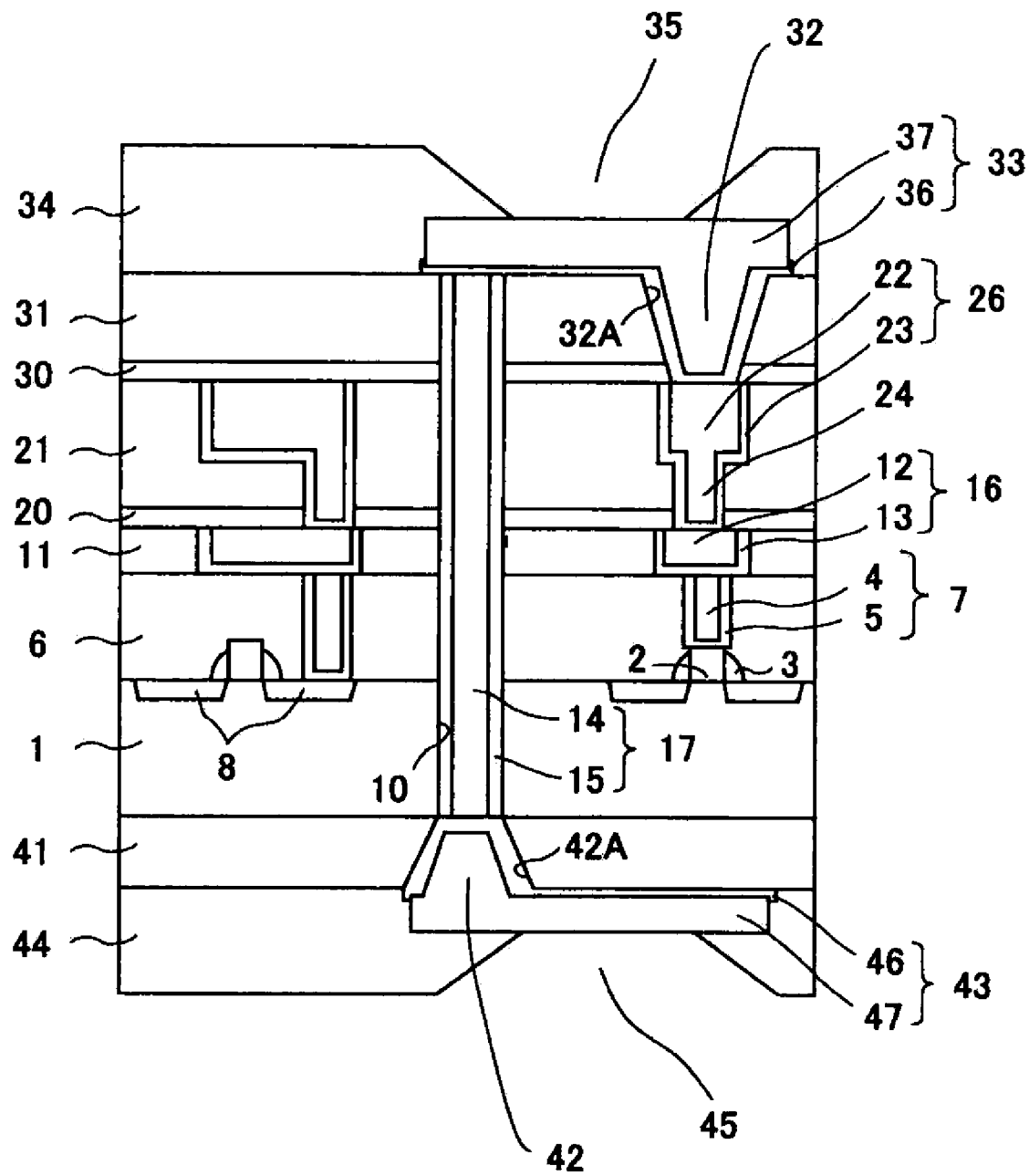
FIG. 4H is a cross-sectional view illustrating a manufacturing step following the manufacturing step of the semiconductor chip in accordance with comparative example 2 illustrated in FIG. 4G.

The subsequent steps illustrated in FIGS. 4G and 4H are the same as those of the first embodiment and, therefore, will not be explained again.

In the method of this comparative example 2, it is possible to use tungsten (W), copper (Cu), aluminum (Al) or tin (Sn) commonly used as an interconnect material, as the through-substrate contact metal 14, as in the first and second embodiments. Unlike the first and second embodiments, however, the through-substrate contact hole 10 is formed after forming low-k films (second insulating film 11 and third insulating film 21), as described above, in the case of the comparative example concerned. Consequently, the sidewalls of the second insulating film 11 and the third insulating film 21, which are low-k films, among the portions of the through-substrate contact hole 10 are formed into a recessed shape. It is therefore not possible to adequately film-form barrier metals made of these metals (W, Cu, Al and Sn). In fact, it has been confirmed that the barrier metal was cut off. Consequently, there arises the problem that the through-substrate contact plug 17 contains a part in which an electrical conductor is not buried, thus failing to conduct electricity.

Furthermore, it has been confirmed that the first via contact 24, the first interconnect layer 16 and the second interconnect layer 26 degrade in resistance to electromigration or stress migration in the periphery of the through-substrate contact plug 17. This is considered due to the fact that when processing the first insulating film 6 using a $C_4F_8$-based gas, the second insulating film and the third insulating film, which are low-k films, changed in quality and the altered portion became liable to absorb moisture from the outside. Consequently, the barrier metal oxidized and the electrical conductor (Cu) migrated.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A semiconductor device comprising:
   a semiconductor substrate having a first surface and a second surface facing each other;
   a first insulating film formed on said first surface of said semiconductor substrate and having a specific permittivity of 4 or higher;
   a circuit constituent element formed on said first surface of said semiconductor substrate and covered with said first insulating film;

a contact plug formed in said first insulating film and electrically connected to said circuit constituent element;
a through-substrate contact plug penetrating through said semiconductor substrate and said first insulating film;
a second insulating film formed on said first insulating film and having a specific permittivity of 3.5 or lower;
a first interconnect layer formed in said second insulating film and electrically connected to said through-substrate contact plug and said contact plug;
a third insulating film formed on said second insulating film and having a specific permittivity of 3.5 or lower;
a second interconnect layer formed in said third insulating film;
a via contact formed in said third insulating film so as to electrically connect said first interconnect layer and said second interconnect layer;
a first electrode formed in an exposed state and external to said third insulating film and electrically connected to said second interconnect layer; and
a second electrode formed in an exposed state and external to said second surface of said semiconductor substrate and electrically connected to said through-substrate contact plug.

2. The semiconductor device according to claim 1, wherein said second insulating film and said third insulating film are made of an inorganic material consisting primarily of a material selected from the group consisting of SiOC, SiOF and SiOCH, or are made of an organic material consisting primarily of polyarylether (PAr).

3. The semiconductor device according to claim 2, wherein said through-substrate contact plug is made of a material selected from the group consisting of tungsten, copper, aluminum and tin.

4. The semiconductor device according to claim 2, further comprising:
a first cap insulating film formed between said second insulating film and said third insulating film; and
a second cap insulating film formed on said third insulating film;
wherein said first cap insulating film and said second cap insulating film are made of a material selected from the group consisting of SiN, SiC and SiCN.

5. The semiconductor device according to claim 1, wherein said through-substrate contact plug is made of a material selected from the group consisting of tungsten, copper, aluminum and tin.

6. The semiconductor device according to claim 1, further comprising:
a first cap insulating film formed between said second insulating film and said third insulating film; and
a second cap insulating film formed on said third insulating film;
wherein said first cap insulating film and said second cap insulating film are made of a material selected from the group consisting of SiN, SiC and SiCN.

7. The semiconductor device according to claim 1, wherein said circuit constituent element is a MOS-FET having a gate interconnect and a source/drain and said gate interconnect and said source/drain are electrically connected to said contact plugs, respectively.

8. The semiconductor device according to claim 1, wherein said first electrode and said through-substrate contact plug are electrically connected to each other through said via contacts provided in a plural number.

9. A stacked semiconductor device comprising:
a first semiconductor device according to claim 1; and
a second semiconductor device according to claim 1;
wherein said first semiconductor device and said second semiconductor device are stacked, and said first electrode of said first semiconductor device and said second electrode of said second semiconductor device stacked on the upper side of said first semiconductor device abut on each other and are in electrical conduction with each other.

* * * * *